United States Patent [19]
Imanishi et al.

[11] Patent Number: 5,870,039
[45] Date of Patent: Feb. 9, 1999

[54] CODE CONVERTER, VARIABLE LENGTH CODE DECODER, AND ASSOCIATED METHODS

[75] Inventors: Hiroshi Imanishi; Masaki Toyokura, both of Osaka, Japan

[73] Assignee: Matsushita Electric Industrial Co., Ltd., Osaka, Japan

[21] Appl. No.: 877,241

[22] Filed: Jun. 17, 1997

[30] Foreign Application Priority Data

Jun. 19, 1996 [JP] Japan ................................. 8-157842

[51] Int. Cl.⁶ .................................................. H03M 7/40
[52] U.S. Cl. ................................................................ 341/67
[58] Field of Search ........................................ 341/67, 65

[56] References Cited

U.S. PATENT DOCUMENTS

| 5,606,370 | 2/1997 | Moon ........................................ 348/390 |
| 5,625,356 | 4/1997 | Lee et al. ................................... 341/67 |
| 5,675,331 | 10/1997 | Watanabe et al. ........................ 341/67 |

FOREIGN PATENT DOCUMENTS 6-350458  12/1994  Japan.

*Primary Examiner*—Brian Young
*Attorney, Agent, or Firm*—McDermott Will & Emery

[57] ABSTRACT

The present invention makes it possible to achieve restoration of decoding processing more intricately in comparison with commonly-used techniques. The present invention increases post-restoration data reliability and is applicable to real-time decoding processing. A variable length code converter of the present invention provides an abnormal code detection signal when a bit-string subjected to conversion corresponds to none of variable length codes that belong in predetermined coding systems. At this time, a controller provides an error signal, and according to the error signal a bit-string is continuously output from a memory which stores bit-strings to be decoded. When the controller detects a header indicative of data partition from an output bit-string of the memory, it cancels the error signal. As a result, bit-string decoding resumes after the detected header.

8 Claims, 8 Drawing Sheets

Fig. 6

| CYCLE | SHIFTER INPUT SIN | BIT-STRING BIN | CODE LENGTH DL | SHIFT AMOUNT SV (ACCUMULATING VALUE) | READ SIGNAL RO |
|---|---|---|---|---|---|
| 1 | 0 0 0 1 1 0 1 1 1 1 1 x x x x x | 0 0 0 1 | 2 | 0 | 0 |
| 2 | 0 0 0 1 1 0 1 1 1 1 1 x x x x x | 0 1 1 0 | 2 | 2 | 0 |
| 3 | 0 0 0 1 1 0 1 1 1 1 1 x x x x x | 1 0 1 1 | 3 | 4 | 0 |
| 4 | 0 0 0 1 1 0 1 1 1 1 1 x x x x x | 1 1 1 1 | 4 | 7 | 1 |
| 5 | 1 1 1 x x x x x x x x x x x x x | x x x x | x | 3 | 0 |

CODE CONVERTER, VARIABLE LENGTH CODE DECODER, AND ASSOCIATED METHODS

BACKGROUND OF THE INVENTION

The present invention relates to a code converter for converting, based on a predetermined coding system, a code into code data, to a variable length code decoder for decoding a bit-string made up of consecutive variable length codes into code data, and to associated methods.

Recently, with the digitization of recording medium and communication channel, data compression by means of entropy coding plays a very important role. In entropy coding, symbols that have a high probabilistic frequency of occurrence are assigned a short code so as to achieve a reduction of the average code length. Particularly, in the field of image processing, the use of variable length code on the basis of a predetermined coding system is proposed by the Moving Picture Expert Group (MPEG which is the international standard for image compression/expansion).

For example, in the event that decoding processing is carried out according to the MPEG standard in DVD apparatus, it requires a variable length code converter having the ability to perform variable length code conversion according to a coding system selected from among a plurality of coding systems. However, implementation of such a code converter produces some problems. One problem is that a plurality of circuits are required for corresponding coding systems. Another problem is that an organization is required for selectively having a circuit corresponding to a selected coding system operate. This further produces the problem that the entire size of the apparatus increases.

Generally, in the event of variable length code decoding, processing, in which the code length of a variable length code is found as decoding information in addition to finding code data corresponding to the variable length code and the code length found is used to obtain the position of a subsequent variable length code's leading bit, is repeatedly carried out. This produces the problem that, when an error occurs in a bit of a variable length code, neither code data corresponding to the error-containing variable length code nor the code length thereof can be obtained, which means that it is impossible to locate the position of a subsequent variable length code's leading bit. To sum up, in regard to variable length codes following an error-containing variable length code, these codes cannot be decoded at all, or even when they are decoded, the results of the decoding may be completely useless, since bit partition positions are unknown.

For the case of the variable length code decoding, if an error, such as "0"/"1" inversion, occurs in a bit-string for some reason, from then on, either it becomes impossible to perform decoding processing or completely inaccurate decoding is carried out.

With a view to solving the above-described drawback, there have been proposed various techniques. For example, one technique for detecting, by means of time interruption, a malfunction of the decoding processing caused by an error occurring in the bit-string, is known in the art. This technique, however, is problematic, for it is impossible to make restoration of decoding processing with accuracy because the decoding processing will not return to normal until a time interruption is made.

Japanese Patent Unexamined Application Laying Open Gazette No. 6-350458 shows a variable length code decoding method with a view to providing a solution to the foregoing problem. When the code length cannot be detected because a cut bit-string corresponds to none of prestored bit-patterns (variable length codes), bit shift information (bit-string cut position control information) is increased or decreased in search of a bit-string cut position that will not make detection of bit-patterns impossible, and the processing of decoding continues at the retrieved position.

The above-described technique, however, suffers the problem that there is the possibility that detection of the bit-patterns is made impossible immediately after the restoration of decoding processing because bit-string cut positions obtained by search may not be always adequate ones. There is produced another problem that the reliability of post-restoration code data is low. Additionally, in order to make decoding processing restoration, a new bit-string cut position is searched using trial-and-error techniques. As result, the search may not be completed timely in real-time decoding processing.

SUMMARY OF THE INVENTION

Accordingly, it is an object of the present invention to provide an improved code converter, which is smaller in circuit size in comparison with conventional ones for performing code conversion according to a plurality of coding systems.

The present invention makes it possible to make restoration of decoding processing more intricately in comparison with commonly-used techniques. Additionally, the present invention increases post-restoration code data reliability and is applicable in real-time decoding processing.

The present invention provides a code converter for converting a coded bit-string into code data on the basis of a coding system selected from among a plurality of coding systems, the code converter comprising:

shared converting means for storing a relationship between codes and code data included in a common portion between a first coding system and a second coding system of said plurality of coding systems and converting a conversion-target bit-string into code data on the basis of said stored relationship;

wherein both code conversion on the basis of said first coding system and code conversion on the basis of said second coding system are carried out using said shared converting means.

In accordance with the present invention, when code conversion is carried out according to one coding system (first coding system), a portion of the first coding system in common with another coding system (second coding system) is code converted by the shared converting means. On the other hand, when code conversion is carried out according to the second coding system, a portion of the second coding system in common with the first coding system is code converted also by the shared converting means. Such arrangement reduces, in size, a circuit corresponding to a common portion between the two coding systems. The present invention provides a code converter that is smaller in circuit size than commonly-used ones.

It is preferred that:

the shared converting means provides a non-detection signal when the conversion-target bit-string does not correspond to any one of codes that belong in the stored relationship; and the code converter further comprises:

selecting means for selectively providing code data converted by the shared converting means as output data of the code converter when a non-detection signal is not provided from the shared converting means, during code conversion on the basis of either the first coding system or the second coding system.

It is preferred for the foregoing code converter to further include:

(a) dedicated converting means for storing a relationship between codes and code data of the first coding system other than stored in said shared converting means, converting a conversion-target bit-string into code data on the basis of the stored relationship, and providing a non-detection signal when the conversion-target bit-string does not correspond to any one of codes that belong in the stored relationship; and (b) abnormal code detecting means for providing an abnormal code detection signal indicative of the presence of an error in a conversion-target bit-string when both the shared converting means and the dedicated converting means provide a non-detection signal, during code conversion on the basis of the first coding system.

The present invention provides a variable length code decoder for decoding a bit-string formed of consecutive variable length codes into code data, the decoder comprising:

(a) a variable length code converter for receiving a conversion-target bit-string cut from said bit string, determining whether said conversion-target bit string corresponds to any one of variable length codes that belong in a predetermined coding system, converting said conversion-target bit-string into code data according to said coding system when there is a corresponding variable length code to said conversion-target bit-string, and providing an abnormal code detection signal indicative of the presence of an error in said conversion-target bit-string when there is no corresponding variable length code to said conversion-target bit-string; and (b) header retrieving means for retrieving a header which is a data partition identifier in said bit-string forward from said conversion-target bit-string when said variable length code converter provides said abnormal code detection signal;

wherein said variable length code decoder interrupts decoding of said bit-string when said variable length code converter provides said abnormal code detection signal, and resumes decoding of said bit-string after said header detected by said header retrieving means.

In accordance with the present invention, in the event that a bit-string, i.e., a target of conversion, corresponds to none of variable length codes that belong in a predetermined coding system, the variable length code converter provides an abnormal code detection signal. In other words, if there occurs an error in an input bit-string, such an error is detected at once, and decoding processing is then interrupted and the header retrieving means retrieves a header which is a data partition indicator forward from the conversion-target bit-string. Since a position immediately after the detected header always serves as an adequate cut position for conversion-target bit-strings, a detection error, i.e., an undesired situation in which there is no correspondence between a conversion-target bit-string and a variable length code that belongs in a predetermined coding system, will not reoccur immediately after decoding processing resumes. Additionally, it is possible to instantly resume decoding because, unlike the conventional techniques, the present invention does not rely on a trial-and-error method to find a new bit-string cut position. Accordingly, the present invention makes it possible to perform restoration of decoding processing more intricately in comparison with commonly-used techniques. Additionally, the present invention increases post-restoration code data reliability and is applicable in real-time decoding processing.

The present invention provides a method for decoding a bit-string of consecutive variable length codes into code data, comprising the steps of:

(a) determining whether a conversion-target bit-string, cut from said bit-string, corresponds to any one of variable length codes that belong in a predetermined coding system;

(b) interrupting decoding of said bit-string and retrieving a header which is a data partition identifier in said bit-string forward from said conversion-target bit-string when said step (a) determines that said conversion-target bit-string corresponds to none of said variable length codes; and (c) resuming decoding of said bit-string after said header detected in said step (b).

In accordance with the present invention, the abnormal code detection step determines whether a bit-string, i.e., a target of conversion, corresponds to any one of variable length codes that belong in a predetermined coding system. This achieves immediate detection of an error in an input bit-string, and decoding processing is then interrupted in the header retrieval step and retrieval of a header which is a data partition identifier is carried out forward from the conversion-target bit-string. Since a position immediately after the detected header is always adequate as a cut position for conversion-target bit-string, a detection error, i.e., an undesired situation in which there is no correspondence between a conversion-target bit-string and a variable length code that belongs in a predetermined coding system, will not reoccur immediately after decoding processing resumes. Additionally, it is possible to instantly resume decoding because, unlike the conventional techniques, the present invention does not rely on a trial-and-error method to find a new bit-string cut position. Accordingly, the present invention makes it possible to perform restoration of decoding processing more intricately in comparison with commonly-used techniques. Additionally, the present invention increases post-restoration code data reliability and is applicable in real-time decoding processing.

BRIEF DESCRIPTION OF THE DRAWINGS

FIG. 6 is a timing chart illustrating the operation of the variable length code decoder of the embodiment of the present invention shown in FIG. 5.

DETAILED DESCRIPTION OF THE INVENTION

Figure 1:
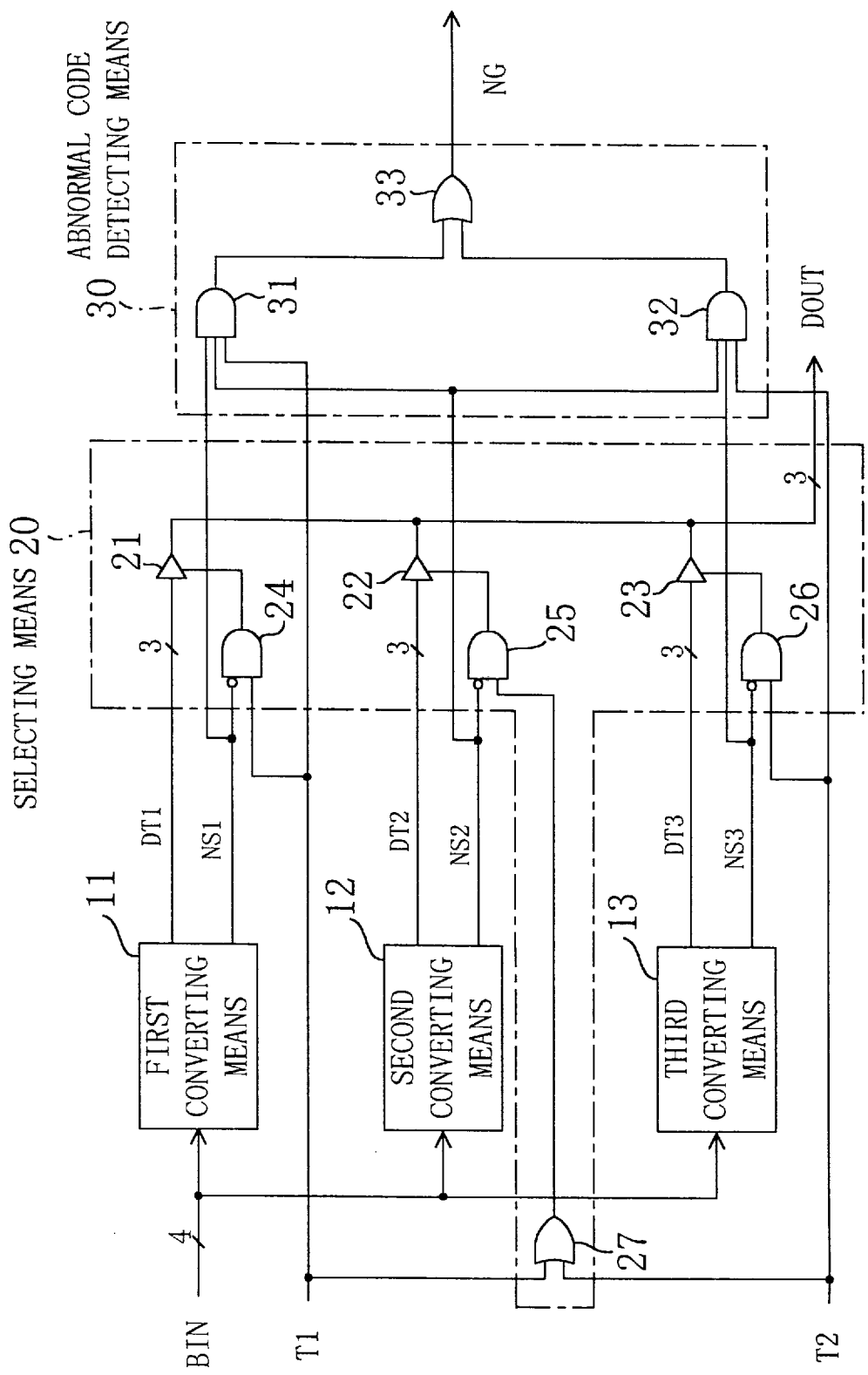
FIG. 1 is a diagram showing a circuit organization of a code converter according to an embodiment of the present invention.

Referring first to FIG. 1, a variable length code converter of a preferred embodiment of the present invention is shown in block form. The variable length code converter performs variable length code conversion according to coding systems T1 and T2.

In the present embodiment, the relationship between variable length codes and code data contained in CODING SYSTEMS T1 and T2 is classified into three groups, namely group I, group II, and group III.

Group I: included in T1 but not included in T2

Group II: included in both of T1 and T2

Group III: not included in T1 but included in T2

Each of GROUPS I–III is provided with a converting means.

11 is a first converting means (a first dedicated converting means) for Group I. 12 is a second converting means (a shared converting means) for Group II. 13 is a third converting means (a second dedicated converting means) for Group III. The first to third converting means 11 to 13 receive a bit-string BIN that is a target of conversion (hereinafter referred to TARGET BIT-STRING BIN) and convert the received BIT-STRING BIN into code data DT1, into code data DT2, and into code DT3, respectively. Additionally, each converting means 11–13 generates a non-detection signal when the received TARGET BIT-STRING BIN corresponds to none of variable length codes that belong in the stored relationship. More specifically, the first converting means 11 generates a non-detection signal NS1, the second converting means 12 generates a non-detection signal NS2, and the third converting means 13 generates a non-detection signal NS3.

20 is a selecting means. According to a selection signal T1 which directs that CODING SYSTEM T1 should be selected and according to a selection signal T2 which directs that CODING SYSTEM T2 should be selected, the selecting means 20 selects among CODE DATA DT1 from the first converting means 11, CODE DATA DT2 from the second converting means 12, and CODE DATA DT3 from the third converting means 13, and the selected code data is provided as the output data from the variable length code converter (DOUT). The selecting means 20 has tristate buffers 21–23, AND gates 24–26, and an OR gate 27. When the control input is at "1", the input signal is provided intact from each tristate buffer 21–23. On the other hand, when the control input is at "0", the output terminals of the tristate buffers 21–23 are placed in the state of high impedance. The AND gates 24–26 control the tristate buffers 1–23. The OR gate 27 generates the OR of SIGNALS T1 and T2. The AND gate 24 generates an AND signal of an inverted signal of SIGNAL NS1 from the first converting means 11 and SIGNAL T1, and the generated AND signal is applied to the first tristate buffer 21, serving as a control input thereof. The AND gate 25 generates an AND signal of an inverted signal of SIGNAL NS2 from the second converting means 12 and an OR signal of SIGNALS T1 and T2 generated by the OR gate 27, and the generated AND signal is applied to the second tristate buffer 22, serving as a control input thereof. The AND gate 26 generates an AND signal of an inverted signal of SIGNAL NS3 from the third converting means 13 and SIGNAL T2, and the generated AND signal is applied to the third tristate buffer 23, serving as a control input thereof. 30 is an abnormal code detecting means which generates to the variable length code converter an abnormal code detection signal NG indicative of the presence of an error in the input bit-string. The abnormal code detecting means 30 has an AND gate 31, an AND gate 32, and an OR gate 33. The AND gate 31 receives SIGNAL NS1 from the first converting means 11, SIGNAL S2 from the second converter means 12, and SIGNAL T1. The AND gate 32 receives SIGNAL NS2 from the second converter means 12, SIGNAL NS3 from the third converting means 13, and SIGNAL T2. The OR gate 33 provides an OR signal of output signals from the AND gates 31 and 32, to an output line of SIGNAL NG.

Referring now to TABLE 1, therein shown are CODING SYSTEMS T1 and T2 in regard to the present embodiment. TABLE 2 is a truth table in binary notation for the foregoing GROUPS I–III wherein variable length codes are the input and code data are the output.

TABLE 1

| VARIABLE LENGTH CODE | CODE DATA |
|---|---|
| CODING SYSTEM T1 | |
| 00 | 1 |
| 01 | 2 |
| 101 | 3 |
| 1111 | 4 |
| CODING SYSTEM T2 | |
| 00 | 1 |
| 01 | 2 |
| 100 | 3 |
| 1110 | 4 |

TABLE 2

| GROUP | INPUT | OUTPUT |
|---|---|---|
| | (variable length code) | (code data) |
| I | 101x | 011 |
| | 1111 | 100 |
| II | 00xx | 001 |
| | 01xx | 010 |
| III | 100x | 011 |
| | 1110 | 100 |

In the variable length code converter of the present embodiment shown in FIG. 1, the first converting means 11 operates according to the GROUP I truth table of TABLE 2. The second converting means 12 operates according to the GROUP II truth table of TABLE 2. The third converting means 13 operates according to the GROUP III truth table of TABLE 2. The converting means 11–13 each store the relationship between variable length codes and code data shown in TABLE 2, thereby converting, based on the respective stored relationship, a bit-string (BIN) of four bits, which is a target of conversion, into DATA DT1, DT2, and DT3, respectively.

When TARGET BIT-STRING BIN does not correspond to any one of the stored codes, the first to third converter means 11–13 each output a "1" to the output lines of SIGNALS NS1, NS2 and NS3. On the other hand, when there is a corresponding code to BIN, the converting means 11–13 each output a "0" to the output lines. In other words, if there is no correspondence between TARGET BIT-STRING BIN and any one of variable length codes that belong in the stored relationship, each of the converting means 11–13 provides a "1" as a non-detection signal (NS1,NS2,NS3).

Based on the truth table (TABLE 2), each of the converting means 11–13 is formed using a sum-of-products standard form. The AND gates (product) are used to detect respective variable length codes and the OR gate (sum) is used to generate, from output signals from the AND gates, code data corresponding to each of the variable length codes.

Figure 2:
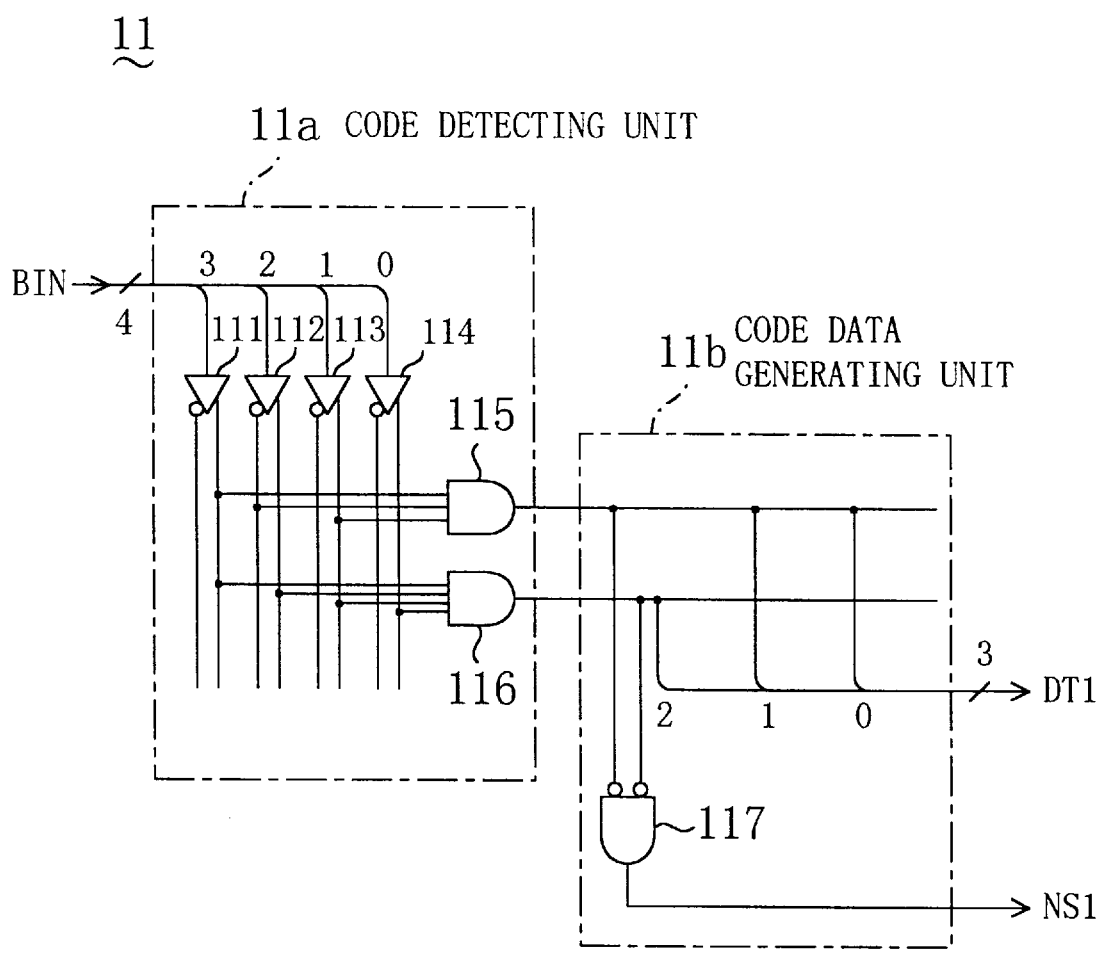
FIG. 2 is a diagram showing an organization of a first converting means 11 of the code converter of the embodiment of the present invention shown in FIG. 1.

FIG. 2 is a circuit diagram showing an organization of the first converting means 11. 11a is a code detecting unit. The code detecting unit 11a receives a target bit-string (BIN) and performs detection of respective variable length codes to provide the result of the detection. 11b is a code data generating unit. The code data generating unit 11b generates, based on the detection result by the code detecting unit 11a, code data corresponding to a detected variable length code. The code data generating unit 11b provides SIGNAL NS1 when no variable length code is detected. The code detecting unit 11a has complementary buffers 111–114 and AND gates 115 and 116. Each of the complementary buffers 111–114 is fed a respective bit of TARGET BIT-STRING BIN and produces a non-inverted signal and an inverted output signal of the input bit. The code data generating unit 11b has a NOR gate 117.

In the complementary buffers 111–114 of the code detecting unit 11a, non-inverted and inverted signals of bits (from bit 3 to bit 0) of the target bit-string (BIN) are generated. Each of the AND gates 115 and 116 corresponds to a variable length code which is a target of detection, and detects whether a corresponding variable length code agrees with TARGET BIT-ST1NG BIN according to the signals generated in the complementary buffers 111–114. The AND gate 115 corresponds to a variable length code of [101x] of GROUP I of TABLE 2. The AND gate 115 receives (a) a non-inverted output signal from the complementary buffer 111 (i.e., a non-inverted signal of the bit 3 of TARGET BIT-STRING BIN), (b) an inverted output signal from the complementary buffer 112(an inverted signal of the bit 2 of BIN), and (c) a non-inverted output signal from the complementary buffer 113 (a non-inverted signal of the bit 1 of BIN), and only when all of these input signals are at "1", in other words, only when TARGET BIT-STRING BIN is [101x], the AND gate 115 provides a "1". On the other hand, the AND gate 116 corresponds to a variable length code of [1111]. The AND gate 116 receives a non-inverted output signal from the complementary buffer 111, a non-inverted output signal from the complementary buffer 112, a non-inverted output signal from the complementary buffer 113, and a non-inverted output signal from the complementary buffer 114. Only when all of these input signals are at "1", in other words only when TARGET BIT-STRING BIN is [1111], the AND gate 116 provides a "1".

The code data generator unit 11b generates DATA DT1 of three bits, wherein the low-order two-bits of DATA DT1 are an output signal from the AND gate 115 and the remaining high-order one-bit is an output signal from the AND gate 116. When the AND gate 115 gives an output signal at "1" and when the AND gate 116 gives an output signal at "0" (that is, in the event that TARGET BIT-STRING BIN is [101x]), [011] is given as the DATA DT1. On the other hand, when the AND gate 115 gives an output signal at "0" and when the AND gate 116 gives an output signal at "1" (that is, in the event that TARGET BIT-STRING BIN is [1111]), [100] is given as the DATA DT1. When the AND gates 115 and 116 each give an output signal at "0" (that is, in the event that TARGET BIT-STRING BIN is neither [101x] nor [1111]), [001] is given as the code data and the NOR gate 117 provides "1" as SIGNAL NS1.

Both of the second and third converting means 12 and 13 are identical in organization with the first converting means 11 shown in FIG. 2.

Figure 3:
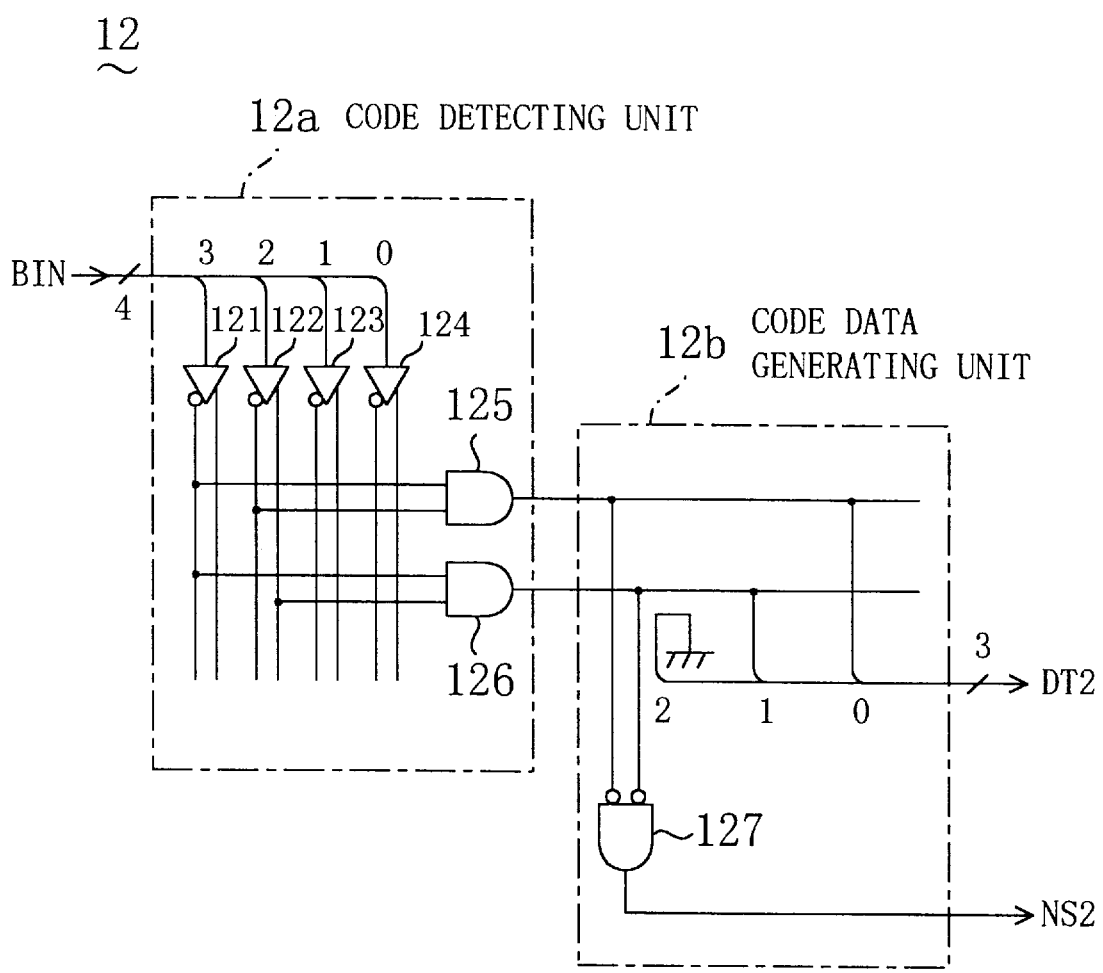
FIG. 3 is a diagram showing an organization of a second converting means 12 of the code converter of the embodiment of the present invention shown in FIG. 1.

FIG. 3 is a circuit diagram illustrating an organization of the second converting means 12. 12a is a code detecting unit. 12b is a code data generator unit. The code detecting unit 12a has complementary buffers 121–124 and AND gates 125 and 126. The code data generator unit 12b has a NOR gate 127.

As can be seen from TABLE 2, the code length of the variable length codes belonging to GROUP II is two bits. Therefore, the second converting means 12 uses only high-order two-bits of a four-bit target bit-string (BIN) in variable length code conversion. The AND gate 125 receives an inverted output signal from the complementary buffer 121 and an inverted output signal from the complementary buffer 122. Only when all of these input signals are at "1", i.e., only when TARGET BIT-STRING BIN is [00xx] shown in GROUP II of TABLE 2, the AND gate 125 provides a "1". On the other hand, the AND gate 126 receives an inverted output signal from the complementary buffer 121 and a non-inverted output signal from the complementary buffer 122. Only when all of these input signals are at "1", i.e., only when TARGET BIT-STRING BIN is [01xx] shown in GROUP II of TABLE 2, the AND gate 126 provides a "1".

The code data generator unit 12b generates DATA DT2 of three bits. The least significant bit (LSB) of DATA DT2 is formed of an output signal from the AND gate 125, the second bit from the LSB is formed of an output signal from the AND gate 126, and the MSB is "1". When the AND gate 125 gives an output signal at "1" and when the AND gate 126 gives an output signal at "0" (that is, when BIN is [00xx]), [001] is provided serving as DATA DT2. On the other hand, when the AND gate 125 gives an output signal at "0" and when the AND gate 126 gives an output signal at "1" (that is, when BIN is [01xx]), [010] is provided serving as DATA DT2. In addition, when both of the AND gates 125 and 126 give an output signal at "0", i.e., when BIN is neither [00xx] nor [01xx], [000] is provided serving as DATA DT2, and the NOR gate 127 provides a "1" as SIGNAL NS1.

Figure 4:
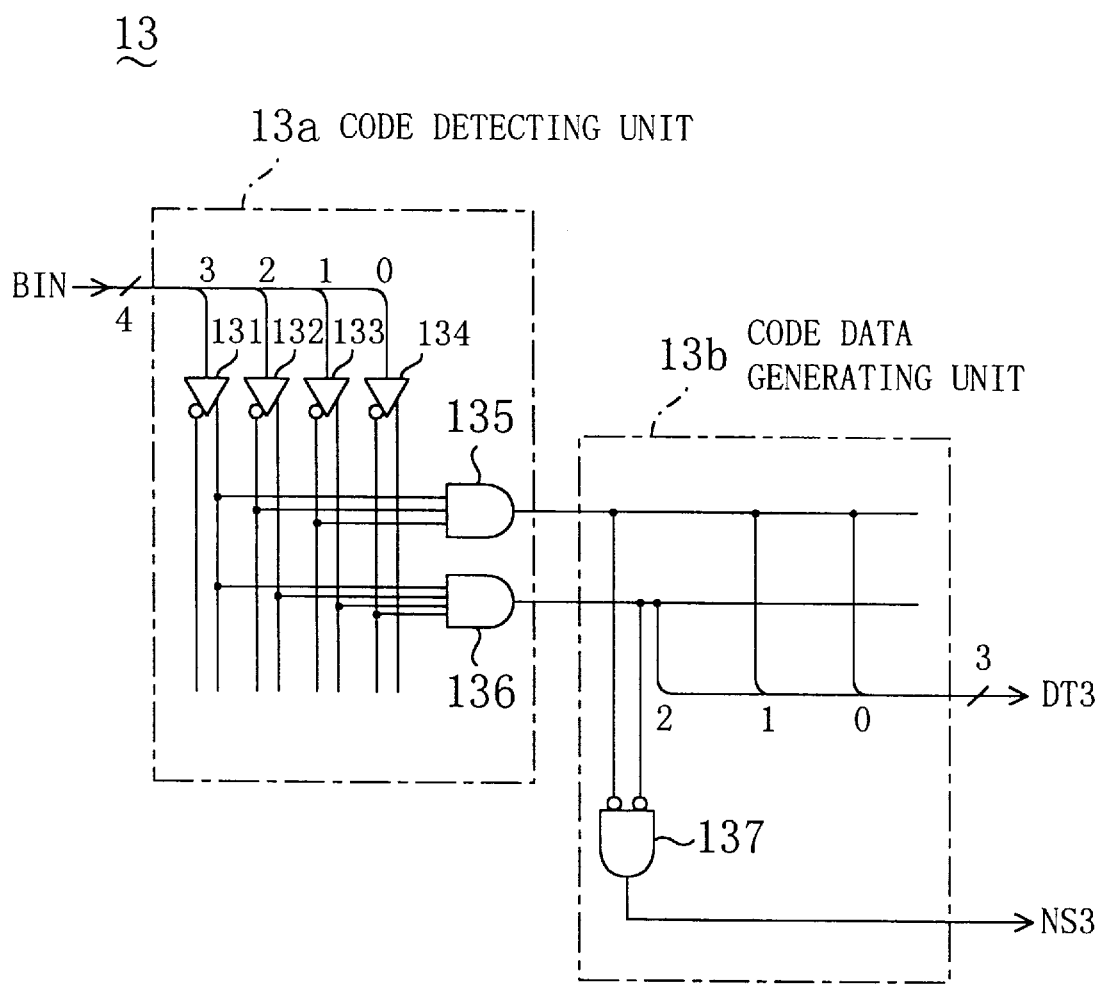
FIG. 4 is a diagram showing an organization of a third converting means 13 of the code converter of the embodiment of the present invention shown in FIG. 1.

FIG. 4 is a circuit diagram showing an organization of the third converting means 13. 13a is a code detecting unit. 13b is a code data generator unit. The code detecting unit 13a has complementary buffers 131–134 and AND gates 135 and 136. The code data generator unit 13b has a NOR gate 137. The AND gate 135 receives a non-inverted output signal from the complementary buffer 131, an inverted output signal from the complementary buffer 132, and an inverted output signal from the complementary buffer 133. Only when all of these input signals are at "1", i.e., only when BIN is [100x] shown in GROUP III of TABLE 2, the AND gate 135 provides a "1". On the other hand, the AND gate 136 receives a non-inverted output signal from the complementary buffer 131, a non-inverted output signal from the complementary buffer 132, a non-inverted output signal from the complementary buffer 133, and an inverted output signal from the complementary buffer 134. Only when all of these input signals are at "1", i.e., only when BIN is [111x] shown in GROUP III of TABLE 2, the AND gate 136 provides a "1".

The code data generator unit 13b generates DATA DT3 formed of three bits, wherein the low-order two-bits of DATA DT3 are an output signal from the AND gate 135 and the MSB is an output signal from the AND gate 136. When the AND gate 135 gives an output signal at "1" and when the AND gate 136 gives an output signal at "0" (that is, when BIN is [100x]), [011] is given as DATA DT3. On the other hand, when the AND gate 135 gives an output signal at "0" and when the AND gate 136 gives an output signal at "1" (that is, when BIN is [1110]), [100] is given as DATA DT3. When both the AND gates 135 and 136 give an output signal at "0", i.e., when BIN is neither [100x] nor [1110], [000] is given as DATA DT3 and the NOR gate 137 provides a "1" as SIGNAL NS3.

The operation of the variable length code converter of the present invention, shown in FIG. 1, is now described below.

At the time when CODING SYSTEM T1 is selected by SIGNAL T1, the first and second converting means 11 and 12 are chosen. On the other hand, at the time when CODING SYSTEM T2 is selected by SIGNAL T2, the second and third converting means 12 and 13 are chosen. Output code data from one or the other of the selected two converter means, whichever has provided no non-detection signal, serves as DOUT (the output data of the variable length code converter).

For example, when SIGNAL T1 is at "1" and when SIGNAL T2 is at "0", in other words when CODING SYSTEM T1 is selected, the output signal from the AND gate 26 becomes "0" since one of inputs of the AND gate 26, i.e., SIGNAL T2, is at "0". As a result, the output of the third tristate buffer 23 enters the high impedance state and DATA DT3 of the third converting means 13 will not be provided as DATA DOUT.

The output signal from the AND gate 24, since one of inputs thereof, i.e., SIGNAL T1, is at "1", comes to have the same value as an inverted signal of SIGNAL NS1 from the first converting means 11 (i.e., the other input). The output signal from the AND gate 25, since one of input signals thereof, i.e., the output signal from the OR gate 27 which is an OR signal of SIGNALS T1 and T2, is at "1", comes to have the same value as an inverted signal of SIGNAL NS2 from the second converting means 12 (i.e., the other input).

If [00xx] is put in as BIN (the target bit-string), then the first converting means 11 provides NS1 at "1" while the second converting means 12 provides SIGNAL NS2 at "0" because the variable length code [00xx] is not included in GROUP I but in GROUP II (see TABLE 2). As a result, the AND gate 24 gives an output signal at "0" and the AND gate 25 gives an output signal at "1". The output from the first tristate buffer 21 enters the high impedance state, and DATA DT2 of the second converting means 12 is provided intact from the second tristate buffer 22. The second converting means 12 provides [001] as DATA DT2 and the variable length code converter provides [001] as DATA DOUT.

At this time, in the abnormal code detecting means 30 the output signal of each AND gate 31 and 32 is at "0" since one of inputs of the AND gate, i.e., SIGNAL NS2 from the second converting means 12, is at "0". The OR gate 33 outputs an OR signal of the output signals of the AND gates 31 and 32 (i.e., "0") to the output line of SIGNAL NG.

If a variable length code that belongs in neither GROUP I nor GROUP II, e.g., [100x], is put in as TARGET BIT-STRING BIN, this causes both the first and second converting means 11 and 12 to provide a "1" as SIGNAL NS1 and as SIGNAL NS2, respectively. In the abnormal code detecting means 30, the output signal from the AND gate 31 becomes "1" because all the input signals are at "1", and the OR gate 33 provides a "1" as SIGNAL NG.

When SIGNAL T1 is at "0" and when SIGNAL T2 is at "1", i.e., when CODING SYSTEM T2 is selected, the variable length code converter of the present embodiment operates in the same way.

As explained above, in accordance with the variable length code converter of the present embodiment, the second converting means 12 is shared in regard to portions common to CODING SYSTEMS T1 and T2, thereby achieving a reduction of the circuit size by such sharing. An improved variable length code converter can be realized which is smaller in circuit size in comparison with ones according to prior techniques. Additionally, the present variable length code converter has the ability to provide an abnormal code detection signal (NG) indicative of the presence of an error in the input target bit-string (BIN).

In the present embodiment, the second converting means 12 is used in regard to every portion common between CODING SYSTEMS T1 and T2. It may be arranged such that the sharing of code converting means is applied only to a part of a common portion between CODING SYSTEMS T1 and T2.

In the present embodiment, the number of coding systems is two. The number may be three or more. Even when three or more coding systems are employed, an organization for the sharing of converting means can be achieved as in the present embodiment.

The present invention is embodied in a variable length code converter. However, it may be embodied in a fixed length code converter. Even in such a case, an organization for the sharing of converting means can be achieved as in the present embodiment.

Figure 5:
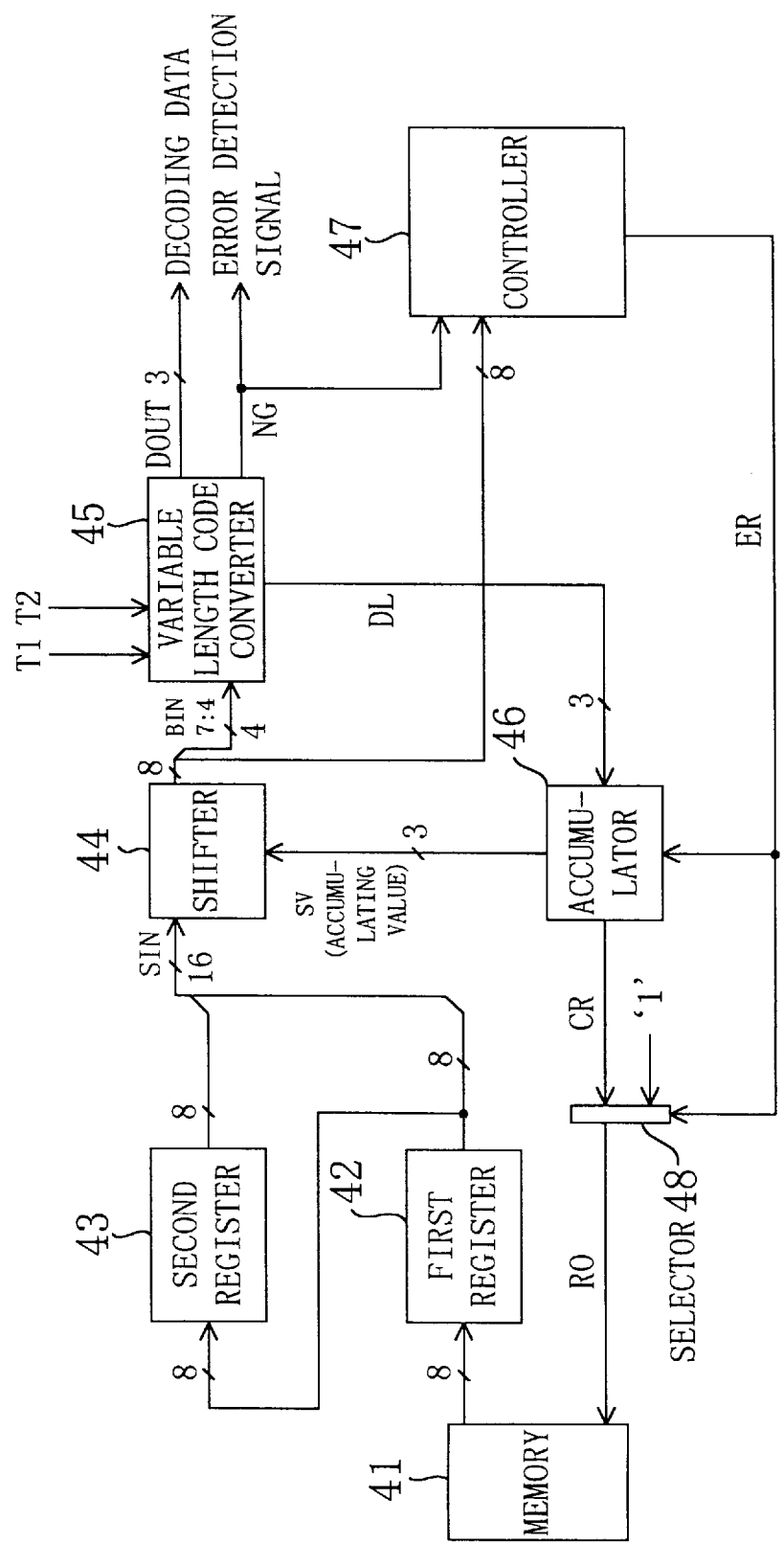
FIG. 5 is a diagram showing an organization of a variable length code decoder according to another embodiment of the present invention.

FIG. 5 shows in block form an organization of a variable length code decoder according to an embodiment of the present invention. This variable length code decoder shown in FIG. 5 incorporates therein a variable length code converter of FIG. 1 having the ability to provide SIGNAL NG. The instant variable length code decoder may be applicable in, for example, variable length code decoding processing in DVD apparatus.

41 is an FIFO memory for storing bit-strings to be decoded. 42 is a first register for storing bit-strings read from the memory 41. 43 is a second register for storing bit-strings output from the first register 42. 44 is a shifter. The shifter 44 receives bit-strings from the first and second registers 42 and 43 as a shifter input SIN. In the shifter 44, SIN is shifted by a shift amount SV in the high-order bit direction and is then provided. 45 is a variable length code converter. In the variable length code converter 45, high-order bits of a bit-string from the shifter 44, which is a target bit-string (BIN), are converted into DOUT (the decoding data) and DL (the code length). 46 is an accumulator for accumulating DL from the variable length code converter 45 and the result of the accumulation is fed, as SV, to the shifter 44. 47 is a controller for performing required control operations when variable length code decoding processing is not carried out normally. 48 is a selector for selecting between an overflow signal CR from the accumulator 46 and a "1" signal for forwarding to the memory 41.

In the memory 41, bit strings that are decoded are aligned in units of eight bits. In response to a "1" signal as SIGNAL RO from the selector 48, the memory 41 provides the bit-strings in units of eight bits. The first and second registers 42 and 43 together form a shift register. The first register 42 stores an 8-bit bit-string from the memory 41 and the stored bit-string is passed to the second register 43. The second register 43 updates the bit-string stored therein every time it receives a bit-string from the first register 42. The shifter 44 receives a bit-string of 16 bits as SIN. The low-order eight-bits of SIN are formed of a bit-string stored in the first register 42 and the high-order eight-bits are formed of a bit-string stored in the second register 43. The shifter 44 then shifts the received 16-bit bit-string in the high-order bit direction by SHIFT AMOUNT SV (i.e., by the number of bits corresponding to the result of the accumulation of DL by the accumulator 46). High-order eight-bits of the resulting bit-string are provided.

High-order four-bits of the 8-bit bit-string from the shifter 44 is fed, as a target bit-string (BIN) subjected to conversion, to the variable length code converter 45. The variable length code converter 45 has an organization shown in FIG. 1. The variable length code converter 45 determines whether the target bit-string (BIN) corresponds to any one of variable length codes belonging in a coding system (CODING SYSTEM T1 (T2)) selected by a selection signal (SIGNAL T1 (T2)). If there is stored a corresponding variable length code to BIN, then corresponding 3-bit code data is provided as DATA DOUT. If there is no corresponding variable length code to BIN, then a "1" is provided as SIGNAL NG. DATA DOUT from the variable length code converter 5 is provided from the variable length code decoder of the present embodiment as decoding data. SIGNAL NG from the variable length code converter 45 is provided from the variable length code decoder as an error detection signal.

In the present embodiment, the variable length code converter 45 generates, as information for finding the position of a leading bit of a variable length code that is subjected to the next conversion, a code length (DL) for variable length code. TABLE 3 shows the relationship among variable length code, code data, and code length for CODING SYSTEM T1. TABLE 4 is a corresponding truth table in binary notation to TABLE 3.

TABLE 3

CODING SYSTEM T1

| VARIABLE LENGTH CODE | DATA | CODE LENGTH |
| --- | --- | --- |
| 00 | 1 | 2 |
| 01 | 2 | 2 |
| 101 | 3 | 3 |
| 1111 | 4 | 4 |

TABLE 4

| INPUT | OUTPUT | |
| --- | --- | --- |
| (variable length code) | DATA | DL |
| 00xx | 001 | 010 |
| 01xx | 010 | 010 |
| 101x | 011 | 011 |
| 1111 | 100 | 100 |

An organization for generating a code length can be implemented easily on the basis of the truth table (TABLE 4) by use of the output signal from the code detecting unit 11a in the variable length code converter 45, as in the code data generator unit 11b shown in FIG. 2.

The accumulator 46 accumulates a 3-bit code length (DL) from the variable length code converter 45 wherein "7" in decimal notation is the accumulation upper limit and the result of the accumulation (the accumulating value) is provided to the shifter 44 as SHIFT AMOUNT SV. When the accumulating value exceeds the upper limit, SIGNAL CR is set at "1". The selector 48 selects SIGNAL CR from the accumulator 46 and provides it to the memory 41 as READ SIGNAL RO, when the controller 47 provides no ERROR SIGNAL ER.

The controller 47 sends out SIGNAL ER when the variable length code converter 45 provides SIGNAL NG. In response to SIGNAL ER from the controller 47, the accumulator 6 is reset to zero and the selector 48 selects and provides a "1" signal as SIGNAL RO to the memory 41. The memory 41 continuously provides its stored bit-strings in units of eight bits.

The normal operation of the variable length code decoder of the present embodiment is first described below. The controller 47 provides no SIGNAL ER and the selector 48 always provides SIGNAL CR from the accumulator 46 to the memory 41 as SIGNAL RO, in the normal operations.

FIG. 6 is a flowchart useful in understanding the normal operation of the variable length code decoder shown in FIG. 5. Suppose here that variable length code conversion based on CODING SYSTEM T1 is carried out.

Suppose here that at cycle 1 the first and second registers 42 and 43 store a bit-string of [111xxxxx] and a bit-string of [00011011], respectively, and the accumulating value of the accumulator 46 is zero. At this time the shifter 44 receives a bit-string of [00011011111xxxxx] (SHIFTER INPUT SIN) and the shift amount (SV) is zero. This causes the shifter 44 to provide a bit-string of [00011011] as enclosed by broken line with respect to SIN (see FIG. 6). High-order four-bits of the output bit-string from the shifter 44 are fed, as TARGET BIT-STRING BIN, to the variable length code converter 45, in other words the four bits [0001] is fed to the variable length code converter 45, serving as TARGET BIT-STRING BIN. According to the truth table (TABLE 4), [001] is provided as DATA DOUT and [010] that is equivalent to two in decimal notation is provided as CODE LENGTH DL. The accumulator 46 accumulates CODE LENGTH DL received from the variable length code converter 45 and the accumulating value thereof becomes two (2).

In cycle 2 the shifter 44 provides a bit-string of [01101111] because SV (the shift amount) is two. In this case, TARGET BIT-STRING BIN becomes [0110]. Based on the truth table (TABLE 4), the variable length code converter 45 provides [010] and [010] that is equivalent to two in decimal notation as DATA DOUT and as CODE LENGTH DL, respectively. The accumulating value of the accumulator 46 becomes four (4).

The present variable length code decoder operates in the same way, also in cycle 3. The shifter 44 provides a bit-string of [10111111] because SHIFT AMOUNT SV=four. In this case, TARGET BIT-STRING BIN becomes [1011]. Based on the truth table (TABLE 4), the variable length code converter 45 provides [011] and [011] that is equivalent to three in decimal notation as DATA DOUT and as CODE LENGTH DL, respectively. The accumulating value of the accumulator 46 becomes seven (7).

The present variable length code decoder operates in the same way, also in cycle 4. The shifter 44 provides a bit-string of [1111xxxx] because SHIFT AMOUNT SV=seven. In this case, TARGET BIT-STRING BIN becomes [1111]. The variable length code converter 45 provides [100] and [100] that is equivalent to four in decimal notation as DATA DOUT and as CODE LENGTH DL, respectively, on the basis of the truth table (TABLE 4).

At this time, the accumulator 46 performs an add operation of 7 (the accumulating value) plus 4 (the code length). However, an overflow occurs since the upper limit of the accumulating value of the accumulator 46 is seven. To cope with the overflow, the accumulating value is set to three, and a "1" is provided as SIGNAL CR. This SIGNAL CR is applied, via the selector 48, to the memory 41 as SIGNAL RO, as a result of which a new bit-string of eight bits, [xxxxxxxx], is read from the memory 41, and a bit-string of [111xxxxx], stored in the first register 42, is stored in the second register 43. At this time, since the shifter input (SIN) becomes [111xxxxxxxxxxxxx] and the shift amount (SV) is three, the shifter 44 provides a bit-string of [xxxxxxxx].

How the variable length code decoder operates at the time when an error occurs in a bit-string, is now described below.

When an error, such as "0"/"1" inversion, occurs in a bit-string for some reason, the correct code length of variable length code cannot be obtained. This may result that decoding processing after the error occurrence either produces completely inaccurate results or cannot be carried out at all. In accordance with the variable length code decoder of the present embodiment shown in FIG. 5, the variable length code converter 45 detects an error occurring in a bit-string, thereafter making a search for a header of the error-containing bit-string.

Figure 7:
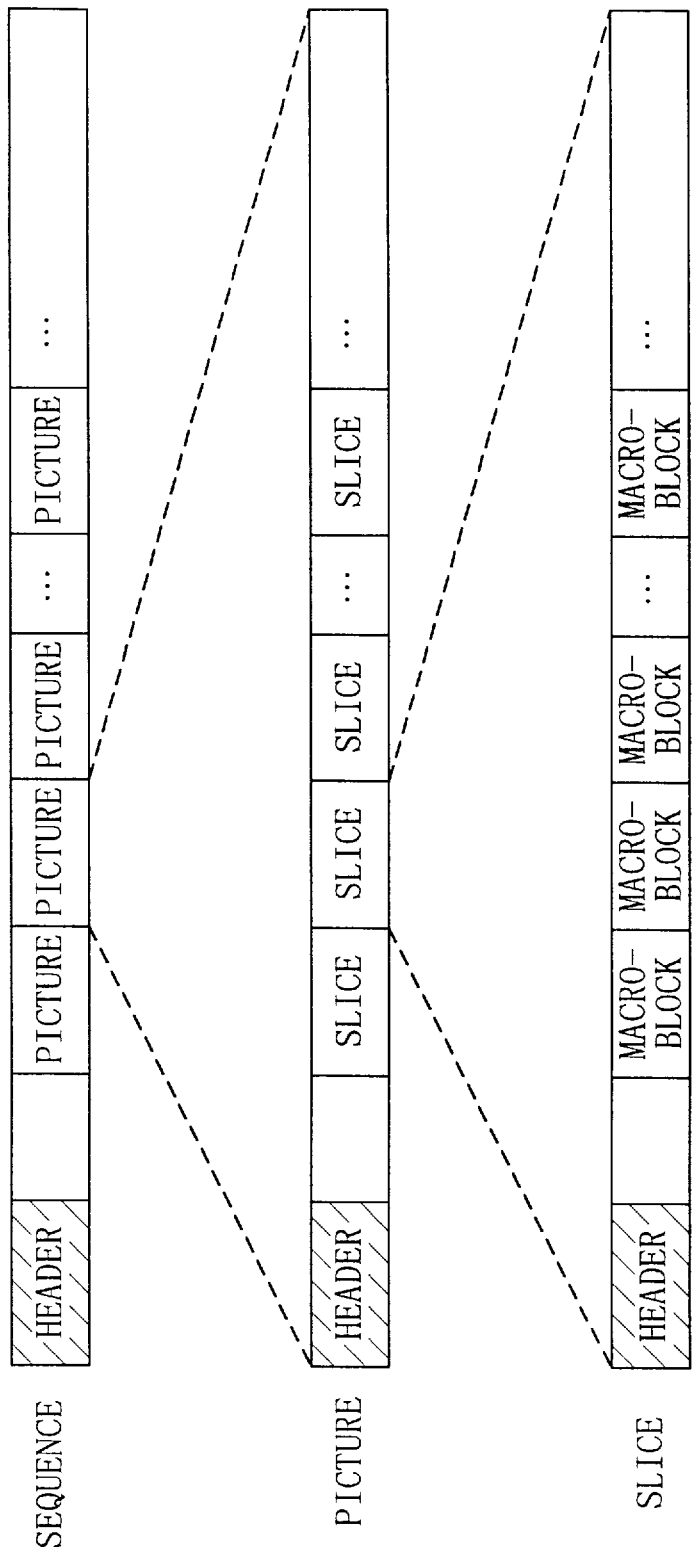
FIG. 7 is a diagram roughly showing organizations of bit-strings in DVD apparatus.

FIG. 7 roughly depicts the organization of a bit-string in DVD apparatus. As shown in the figure, a bit-string has a hieralchical structure formed of slice, picture, and sequence. A sequence, which is equivalent to an entire bit-string, is formed of some pictures. A picture is formed of some slices. A slice is formed of a collection of data called a macroblock. Each of the slice, macroblock, and sequence is provided with a header which is a data head identifier. In the MPEG standard (the international standards for image compression processing), a bit-string serving as a start code prefix indicative of the beginning of a header is specified as having a "1" following 23 or more zeros. The header includes, in addition to such a start code prefix, a start code value of eight bits which represents the type of header (slice, picture, sequence).

In the variable length code decoder shown in FIG. 5, the variable length code converter 45 provides SIGNAL NG (the abnormal code detection signal) when an input target bit-string (BIN) corresponds to none of the stored variable length codes. In response to SIGNAL NG from the variable length code converter 45, the controller 47 controls the variable length code decoder to interrupt decoding processing for making a search forward from the target bit-string (BIN) for a bit-string header.

To sum up, when the variable length code converter 45 provides SIGNAL NG the controller 47 provides SIGNAL ER. According to SIGNAL ER, the accumulator 46 is reset to zero and the selector 48 provides to the memory 41 a "1" signal as SIGNAL RO. As a result, bit strings are read from the memory 41 in units of eight bits. Since the shift amount (SV) of the shifter 44 is zero, the shifter 44 provides bit strings stored in the memory 41 by eight bits. The controller 47 monitors output 8-bit bit-strings from the shifter 44. When the shifter 44 provides a bit-string identical with a start code prefix indicative of the beginning of a header, which is identified as detection of a header, the controller 47 cancels SIGNAL ER. As a result of such cancellation, normal variable length code decoding processing resumes immediately after the detected header.

For the case of MPEG, consecutive output of [00000000], [00000000], and [00000001] from the shifter 44 is identified as the fact that a header is detected. In this way, a slice (picture, sequence) header is detected Even when an error occurs in the bit-string, the above-described operations ensure that variable length decoding processing returns to normal in a short time. Since normal variable length code decoding processing is able to resume from the next slice, bit-string error has no serious effect on the data.

In the present embodiment, a head retrieving means is formed of the controller 47 and the selector 48, and the memory 41, the first and second registers 42 and 43, the shifter 4 and the accumulator 46 used in normal operations. In other words, the present variable length code decoder is implemented by adding the controller 47 and the selector 48 to a commonly-used variable length code decoder, and the header retrieving means is realized using a very simple organization.

It is to be noted that the application of the present variable length code decoder shown in FIG. 5 is not limited to variable length code decoding in DVD apparatus. The present variable length code decoder may be applicable to variable length code decoding in regard to bit strings having a header indicative of data partition.

Figure 8:
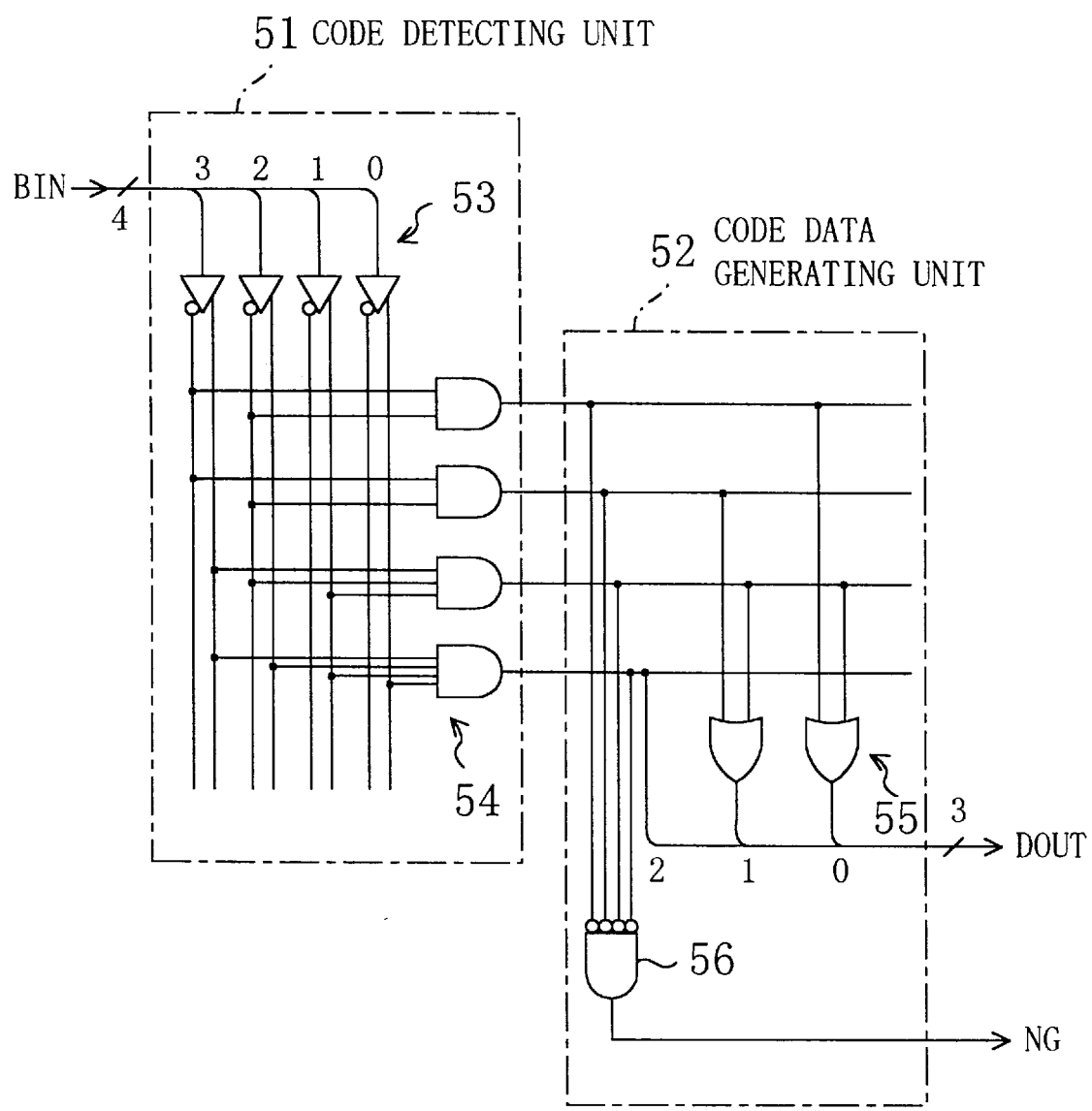
FIG. 8 shows an exemplary organization of a variable length code converter incorporated in a variable length code decoder according to an embodiment of the present invention.

The organization of the variable length code converter 45 shown in FIG. 5 is not limited to the one shown in FIG. 1. Another organization without a plurality of converting means shown in FIG. 8 may be used. FIG. 8 shows a variable length code converter. This code converter has a code detecting unit 51 that is almost identical in organization with the first converting means 11 shown in FIG. 2, and a code data generator unit 52. The code detecting unit 51 is fed TARGET BIT-STRING BIN and performs detection of respective variable length codes. Based on the result of the detection operation by the code detecting unit 51, the code data generator unit 52 generates DATA DOUT corresponding to a detected variable length code and SIGNAL NG. The code detecting unit 51 includes a group of complementary buffers 53 and a group of AND gates 54 corresponding to respective variable length codes. The complementary buffer 53 receives a respective bit of a target bit-string (BIN) and provides a non-inverted signal and an inverted signal of the received bit. The code data generating unit 52 has an OR gate 55 and a NOR gate 56. The OR gate 55 generates DATA OUT from output signals from the AND gates 54. The NOR gate 56 generates SIGNAL NG from output signals from the AND gates 54.

The present embodiment is embodied in a variable length code decoder. However, it may be embodied in an algorithm for variable length code decoding software including the steps of detecting an abnormal code and detecting a header.

The invention claimed is:

1. A code converter for performing code conversion on the basis of a coding system selected from among a plurality of coding systems, comprising:

shared converting means for storing a relationship between codes and code data included in a common portion between a first coding system and a second coding system of said plurality of coding systems and converting a conversion-target bit-string into converted code data on the basis of said stored relationship;

wherein both code conversion on the basis of said first coding system and code conversion on the basis of said second coding system are carried out using said shared converting means.

2. A code converter according to claim 1, said shared converting means providing a non-detection signal when said conversion-target bit-string does not correspond to any one of said codes from said relationship stored in said shared converting means; and said code converter further comprising:

selecting means for selectively providing said converted code data as output data of said code converter when said non-detection signal is not provided from said shared converting means, during code conversion on the basis of either said first coding system or said second coding system.

3. A code converter according to claim 2 further comprising:
(a) dedicated converting means for storing a relationship between codes and code data of said first coding system other than said relationship stored in said shared converting means, converting said conversion-target bit-string into first converted code data on the basis of said relationship stored in said dedicated converting means, and providing a non-detection signal when said conversion-target bit-string does not correspond to any one of said codes from said relationship stored in said dedicated converting means; and
(b) abnormal code detecting means for providing an abnormal code detection signal indicative of the presence of an error in said conversion-target bit-string when both said shared converting means and said dedicated converting means provide non-detection signals, during code conversion on the basis of said first coding system.

4. A code converter according to claim 1,
said shared converting means providing a non-detection signal when said conversion-target bit-string does not correspond to any one of said codes from said relationship stored in said shared converting means;
said code converter further comprising:
(a) first dedicated converting means for storing a relationship between codes and code data of said first coding system other than said relationship stored in said shared converting means, converting said conversion-target bit-string into first converted code data on the basis of said relationship stored in said first dedicated converting means, and providing a non-detection signal when said conversion-target bit-string does not correspond to any one of said codes from said relationship stored in said first dedicated converting means;
(b) second dedicated converting means for storing a relationship between codes and code data of said second coding system other than said relationship stored in said shared converting means and other than said relationship stored in said first dedicated converting means, converting said conversion-target bit-string into second converted code data on the basis of said relationship stored in said second dedicated converting means, and providing a non-detection signal when said conversion-target bit-string does not correspond to any one of said codes from said relationship stored in said second dedicated converting means;
(c) selecting means for, during code conversion on the basis of said first coding system, selectively providing said converted code data converted by said shared converting means or said first converted code data converted by said first dedicated converting means, whichever has not provided a non-detection signal, as output data of said code converter, and, during code conversion on the basis of said second coding system, selectively providing said converted code data converted by said shared converting means or said second converted code data converted by said second dedicated converting means, whichever has not provided a non-detection signal, as output data of said code converter; and
(d) abnormal code detecting means for, during code conversion on the basis of said first coding system, providing an abnormal code detection signal indicative of the presence of an error in said conversion-target bit-string when both said shared converting means and said first dedicated converting means provide non-detection signals, and, during code conversion on the basis of said second coding system, providing said abnormal code detection signal when both said shared converting means and said second dedicated converting means provide non-detection signals.

5. A variable length code decoder for decoding a bit-string formed of consecutive variable length codes into code data, comprising:
(a) a variable length code converter for receiving a conversion-target bit-string cut from said bit string, determining whether said conversion-target bit string corresponds to any one of variable length codes that belong in a predetermined coding system, converting said conversion-target bit-string into code data according to said coding system when there is a corresponding variable length code to said conversion-target bit-string, and providing an abnormal code detection signal indicative of the presence of an error in said conversion-target bit-string when there is no corresponding variable length code to said conversion-target bit-string; and
(b) header retrieving means for retrieving a header which is a data partition identifier in said bit-string forward from said conversion-target bit-string when said variable length code converter provides said abnormal code detection signal;
wherein said variable length code decoder interrupts decoding of said bit-string when said variable length code converter provides said abnormal code detection signal, and resumes decoding of said bit-string after said header detected by said header retrieving means.

6. A variable length code decoder according to claim 5 wherein said variable length code converter is operable to convert a conversion-target bit-string into code data according to a single coding system and provides an abnormal code detection signal when there is no corresponding variable length code that belongs in said single coding system to a conversion-target bit-string.

7. A variable length code decoder according to claim 5 wherein said variable length code converter converts a bit-string into code data on the basis of a coding system selected from among a plurality of coding systems and comprises:
(a) shared converting means for storing a relationship between variable length codes and code data included in a common portion between a first coding system and a second coding system, converting a conversion-target bit-string into code data on the basis of said stored relationship, and providing a non-detection signal when a conversion-target bit-string does not correspond to any one of variable length codes that belong in said stored relationship;
(b) dedicated converting means for storing a relationship between variable length codes and code data of said first coding system other than stored in said shared converting means, converting a conversion-target bit-string into code data on the basis of said stored relationship, and providing a non-detection signal when said conversion-target bit-string does not correspond to any one of variable length codes that belong in said stored relationship;

(c) selecting means for selectively providing code data converted by said shared converting means or said dedicated converting means, whichever has not provided a non-detection signal, as output data of said variable length code converter during variable length code conversion on the basis of said first coding system;

(d) abnormal code detecting means for providing said abnormal code detection signal when both said shared converting means and said dedicated converting means provide said non-detection signal during variable length code conversion on the basis of said first coding system.

8. A method for decoding a bit-string of consecutive variable length codes into code data, comprising the steps of:

(a) determining whether a conversion-target bit-string, cut from said bit-string, corresponds to any one of variable length codes that belong in a predetermined coding system;

(b) interrupting decoding of said bit-string and retrieving a header which is a data partition identifier in said bit-string forward from said conversion-target bit-string when said step (a) determines that said conversion-target bit-string corresponds to none of said variable length codes; and (c) resuming decoding of said bit-string after said header detected in said step (b).

* * * * *